United States Patent [19]

Nakamura

[11] 4,306,201
[45] Dec. 15, 1981

[54] SIGNAL PROCESSING CIRCUIT

[75] Inventor: Shoichi Nakamura, Tokyo, Japan

[73] Assignee: Sony Corporation, Tokyo, Japan

[21] Appl. No.: 77,179

[22] Filed: Sep. 20, 1979

[30] Foreign Application Priority Data

Sep. 22, 1978 [JP] Japan .................. 53-116828

[51] Int. Cl.³ .................................. H03F 1/34
[52] U.S. Cl. ................... 330/294; 330/109;
330/149; 330/305; 330/306
[58] Field of Search .............. 330/86, 109, 126, 149,
330/282, 284, 304, 306, 305; 333/14, 28 T, 28
R, 172, 174; 360/65; 179/1 D, 100.1 R, 100.4
A; 328/167

[56] References Cited

U.S. PATENT DOCUMENTS

| | | | |
|---|---|---|---|
| 3,665,345 | 5/1972 | Dolby | 333/14 |
| 4,072,914 | 2/1978 | Haramoto et al. | 333/14 |
| 4,162,462 | 7/1979 | Endoh | 333/14 |

FOREIGN PATENT DOCUMENTS

| | | |
|---|---|---|
| 479070 | 1/1938 | United Kingdom . |
| 1120541 | 7/1968 | United Kingdom . |
| 1367002 | 9/1974 | United Kingdom . |
| 1398732 | 6/1975 | United Kingdom . |
| 1412702 | 11/1975 | United Kingdom . |
| 1462719 | 1/1977 | United Kingdom . |
| 1500192 | 2/1978 | United Kingdom . |
| 2003707 | 3/1979 | United Kingdom . |

*Primary Examiner*—James B. Mullins
*Attorney, Agent, or Firm*—Lewis H. Eslinger; Alvin Sinderbrand

[57] ABSTRACT

A signal processing circuit for improving the signal-to-noise ratio of input signals, such as audio signals recorded on tape, has a low-pass filter circuit for controllably filtering signals at the lower end of the frequency spectrum, and a high-pass filter circuit for controllably filtering signals at the higher end of the frequency spectrum, with the high-pass filter circuit and the low-pass filter circuit defining the only paths through the signal processing circuit for the input signals. Associated control circuitry provides first and second control signals to control the attenuation of signals at the lower-frequency and higher-frequency parts of the spectrum, respectively, in dependence on the amplitude of the input signals in the respective parts of the spectrum. Preferably, the controllable low-pass and high-pass filter circuits are connected in parallel between input and output terminals, a low-frequency band control unit is provided to control the amount of attenuation of the low-pass filter circuit and a high-frequency band control unit is provided to control the cut-off frequency of the high-pass filter circuit. In one practical arrangement for recording audio signals, signals taken from the output terminal of the signal processing circuit are recorded on tape. For playing back these recorded signals, the input and output terminals of the processing circuit are respectively connected to the output terminal and negative feedback input of an operational amplifier.

7 Claims, 8 Drawing Figures

4,306,201

SIGNAL PROCESSING CIRCUIT

BACKGROUND OF THE INVENTION

1. Field of the Invention

This invention relates to signal processing circuits for improving the signal-to-noise ratio of a recorded and reproduced information signal, and more particularly is directed to a signal processing circuit for suppressing or eliminating low- and high-frequency noises superimposed on an information signal in the recording and/or reproducing playback thereof.

2. Brief Description of the Prior Art

In order to use recording tape most efficiently, it is desirable to record information signals on the tape while the tape is transported at a low speed. However, the level of noise superimposed on the information signals during recording and reproducing is greatly increased at low transport speed.

To suppress or eliminate such noise, several systems have been proposed, such as the noise reduction systems disclosed in U.S. Pat. No. 3,665,345 and in U.S. Pat. No. 3,911,371.

U.S. Pat. No. 3,665,345 discloses a wide band noise reduction system in which the information signals are passed, without processing, through a main signal path between an input terminal and an output terminal, and in which an additional path for the information signals filters and limits signals passing between the input and output terminals. For low amplitude signals, the noise reduction system of U.S. Pat. No. 3,665,345 acts as an all-pass filter, while for high-amplitude signals, the system acts as a high- or as a low-pass filter. In one version of such noise reduction system, two additional paths are provided, with one of such paths blocking those signals lower than about 100 Hz and the other additional path passing only those signals lower than 2 KHz. The extreme opposite portions of the voice spectrum are respectively blocked in the two additional paths to reduce noise modulation effects. In such a noise reduction system, the frequency responses of the additional paths overlap for substantial portions of their frequency bands. Thus, there is a lack of independence of the high-frequency and low-frequency portions of the overall frequency response of such a noise reduction system.

U.S. Pat. No. 3,911,371 describes a technique to increase the signal-to-noise ratio of an input information signal by compressing the dynamic range of the signal. Such a technique involves using a variable filter in which a control signal, based upon the amplitude of the information signal as a whole, controls the frequency characteristic of the filter. The noise reduction technique according to U.S. Pat. No. 3,911,371 also lacks independence between the frequency response characteristic for high-frequency signals and that for low-frequency signals. While such technique disclosed in U.S. Pat. No. 3,911,371 has proved more or less satisfactory for information signals recorded on a tape which is transported at a relatively high speed, noise signals, especially in a low-frequency band, are not completely reduced if a lower tape transport speed is used.

The dynamic range compression technique makes use of the fact that noise is particularly objectionable when the amplitude of the information signal is low and does not mask the noise. According to such technique, low amplitude signals are amplified more than high amplitude signals before these signals are applied to a part of the transmission medium (i.e., recording tape) where a specific type of noise is likely to be added to the original signal.

The advantage of dynamic range compression in a recording and reproducing system is the suppression of low-amplitude noise signals, such as might be introduced by the recording medium itself or might be picked up by the recording and/or reproducing transducer. In the recording system, low-amplitude signals are given more gain than high-amplitude signals resulting in dynamic-range compressed signals, and then these compressed signals are recorded on a recording medium. Thereafter, a reproducing system amplifies the recorded signals so as to afford less gain to the relatively low-amplitude signals than to the relatively high-amplitude signals, thereby to restore the dynamic range of the original signal. In other words, the overall recording and reproducing system affects the signals uniformly by having the reproducing system compensate for modification in signal amplitude introduced by the recording system. Thus, low-amplitude noise signals introduced during recording or reproducing pass only through those parts of the total transmission path in which they are amplified relatively little. If the foregoing technique is applied to the higher-frequency portion of the information signal bandwidth, high-frequency noise, such as tape hiss, can be eliminated. Similarly, if this technique is applied to the lower-frequency portion of the frequency band of the information signal, low frequency noise, such as hum, can be eliminated.

When a lower tape speed is used, it is especially important to be able to eliminate both the low-frequency noise (hum) and the high frequency noise (hiss). However, in order to achieve a reduction in both the high and low frequency noises, it is necessary to control the dynamic range of the lower frequency signals and the dynamic range of the higher-frequency signals independently from one another.

OBJECTS AND SUMMARY OF THE INVENTION

It is an object of this invention to provide an improved circuit for processing information signals to reduce or eliminate low-amplitude noise signals in both the low- and high-frequency portions of the frequency spectrum of the information signals.

It is another object of this invention to provide a signal processing circuit for reducing or eliminating low-amplitude noise signals of the type which occur when information signals are recorded on and played back from tape which is transported at a low speed.

According to an aspect of this invention, a circuit for processing input information signals extending over a predetermined frequency spectrum includes an input terminal for receiving the input information signals, an output terminal for providing processed signals, control circuitry for providing a first control signal in accordance with the amplitude of the input information signal at a lower-frequency part of the spectrum and for providing a second control signal in accordance with the amplitude of the input information signals at a higher-frequency part of the spectrum, and a controllable signal pathway providing the only signal paths from the input terminal to the output terminal. The controllable signal pathway consists essentially of a low-pass filter circuit and a high-pass filter circuit, preferably connected in parallel between the input and output terminals. The low-pass filter circuit has a controllable frequency-response characteristic for controlling the attenuation of signals at the lower-frequency part of the spectrum in response to the first control signal, while the high-pass filter has a controllable frequency response characteristic for controlling the attenuation of signals at the higher-frequency part of the spectrum in response to the second control signal. The low-pass filter preferably includes an attenuator having a transistor arranged as a variable impendence which is controllable in response to the first control signal. The high-pass filter preferably includes a transistor arranged as a cut-off frequency control for varying the cut-off frequency of the high-pass filter in response to the second control signal.

The above, and other objects and features of this invention will be apparent, from the following detailed description of an illustrative embodiment which is to be read in conjunction with the accompanying drawings.

DETAILED DESCRIPTION OF A PREFERRED EMBODIMENT

Figure 1:
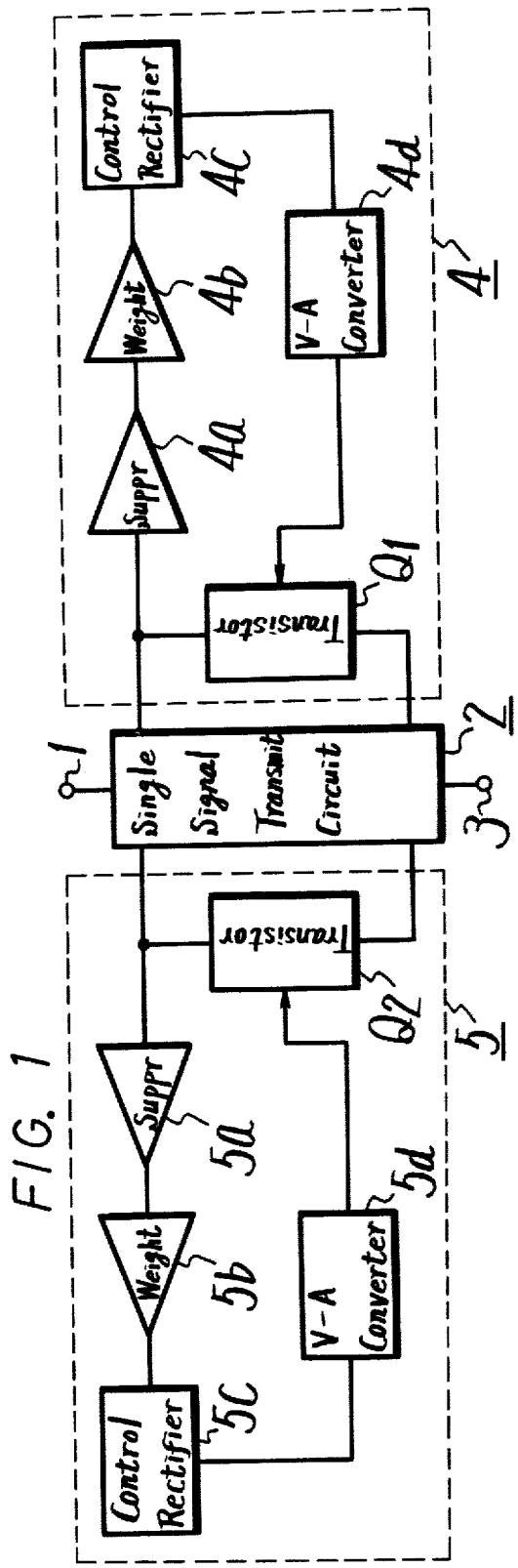
FIG. 1 is a block diagram showing an embodiment of a signal processing circuit according to this invention.

Referring to FIG. 1 in detail, it will be seen that the invention is there shown applied to a signal processing circuit suitable for use with the audio system of a video tape recorder. In the signal processing circuit shown in FIG. 1, an information signal, such as an audio signal that is sufficiently amplified for recording, is applied via an input terminal 1 to a single signal transmitting circuit 2. An information signal, as processed by the single signal transmitting circuit 2, is applied from an output terminal 3 thereof to a magnetic recording transducer (not shown) for recording of the processed information signal on a magnetic tape. A low-frequency band control unit 4 and a high-frequency band control unit 5 detect the signal levels at low- and high-frequency portions of the audio band, respectively, to control respective portions of the single signal transmitting circuit 2. While only single input and output terminals are shown at 1 and 3, it is apparent that second input and output terminals could be provided and connected to a convenient circuit ground. The operation and construction of the control units 4 and 5 will be discussed more fully below.

Figure 2:
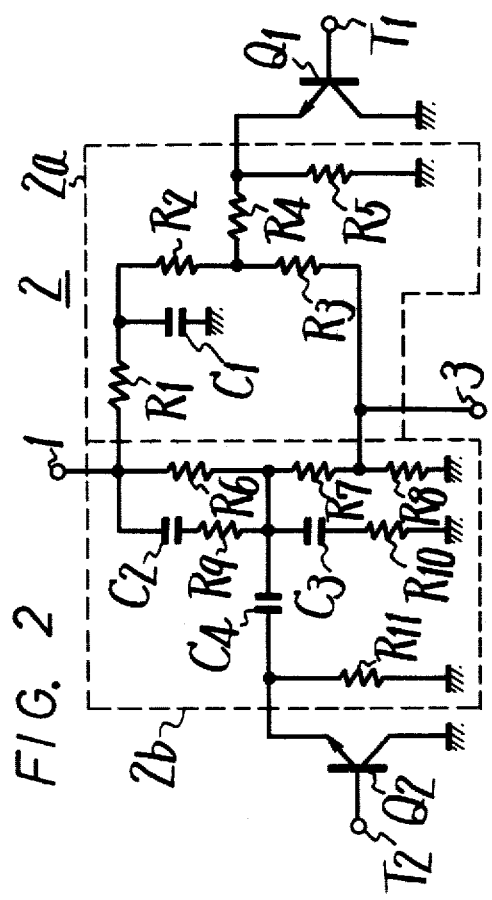
FIG. 2 is a circuit diagram showing in detail a part of the signal processing circuit of FIG. 1.

As shown in detail in FIG. 2, the single signal transmitting circuit 2 has two portions, namely, a low-frequency band attenuation control circuit 2a and a high-frequency-band attenuation control circuit 2b respectively connected to control units 4 and 5.

Figure 3A:
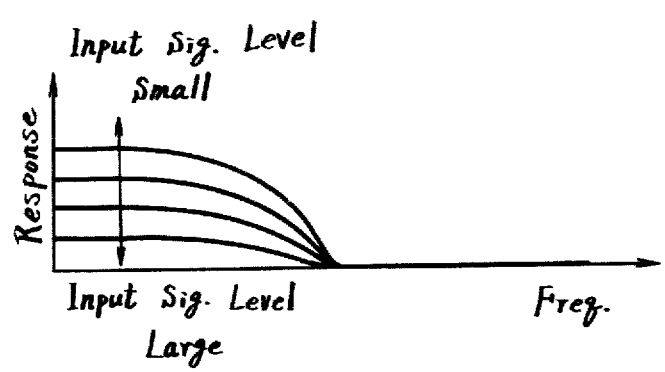
FIGS. 3A, 3B, and 3C are graphs showing frequency-response characteristics of the circuit of FIG. 1, and to which reference will be made in explaining the present invention.

In the low-frequency-band attenuation control circuit 2a, a series circuit of resistors $R_1$, $R_2$ and $R_3$ connects the input terminal 1 to the signal output terminal 3. A capacitor $C_1$ is connected between the junction of resistors $R_1$ and $R_2$ and ground. The junction of resistors $R_2$ and $R_3$ is connected, through a resistor $R_4$ to the emitter of a control transistor $Q_1$ which has its collector connected to ground. The base of transistor $Q_1$ is connected to a control signal terminal $T_1$ to receive a control signal from the low-frequency-band control unit 4. In the low-frequency-band attenuation control circuit 2a, resistors $R_1$-$R_5$ and capacitor $C_1$ from a low-pass filter, and transistor $Q_1$ acts as an attenuation control device. The frequency-response characteristic of the low-frequency-band attenuation control circuit 2a is shown in FIG. 3A, wherein a double-headed arrow indicates variations in the magnitude of the input information signal within the range of low frequencies acted upon by the low-frequency-band attenuation control circuit 2a. As is shown in FIG. 3A, the transfer function at output terminal 3 decreases as the level of the input information signal at input terminal 1 increases. In other words, the amount of attenuation provided by the low-frequency-band attenuation control circuit 2a increases as the input information signal level increases.

Figure 3B:
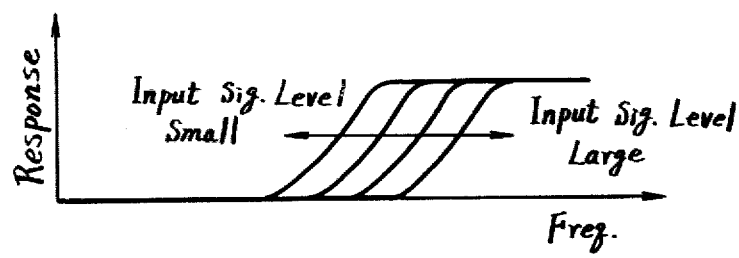

In the high-frequency-band attenuation control circuit 2b, a series circuit of resistors $R_6$, $R_7$ and $R_8$ extends between input terminal 1 and ground. A capacitive network is formed of a capacitor $C_2$, a resistor $R_9$, a capacitor $C_3$ and a resistor $R_{10}$ connected in series between input terminal 1 and ground. The junction between resistors $R_7$ and $R_8$ is connected to output terminal 3. The junction of resistor $R_9$ and capacitor $C_3$ and the junction of resistors $R_6$ and $R_7$ are connected together, and area also connected through a capacitor $C_4$ to the emitter of a transistor $Q_2$ which has its collector connected to ground. Another resistor $R_{11}$ is connected between the emitter of transistor $Q_2$ and ground. The base of transistor $Q_2$ is connected to a control signal input terminal $T_2$ to receive control signals supplied by high-frequency-band control unit 5. The capacitors $C_2$ and $C_3$ and the transistors $R_6$-$R_{10}$ act as a high-pass filter, while transistor $Q_2$ and resistor $R_{11}$ act to control the cut-off frequency of such high-pass filter. The frequency response characteristic of the high-frequency-band attenuation control circuit 2b is shown in FIG. 3B, in which a double-headed arrow indicates variations in the magnitude of the input information signal within the range of high frequencies acted upon by circuit 2b. As is shown therein, the cut-off frequency increases as the level of the input information signal in the high-frequency portion of the spectrum increases, and the cut-off frequency decreases as the amplitude of that portion of the input information signal becomes low. Raising the cut-off frequency has effect of decreasing the attenuation, as is apparent from FIG. 3B.

Figure 3C:
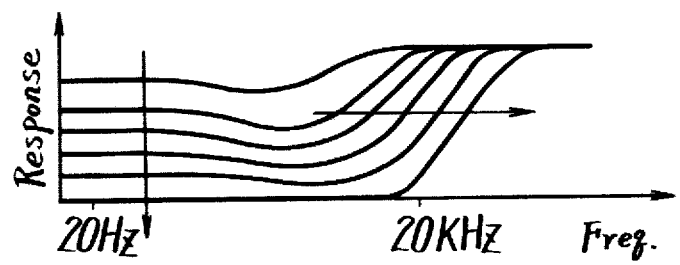

In one practical embodiment of the signal processing circuit shown in FIG. 2, the values of the various resistors and capacitors are as follows:

$R_1 = 58.2 K\Omega$
$R_2 = 22 K\Omega$
$R_3 = 27 K\Omega$
$R_4 = 750 \Omega$
$R_5 = 18 K\Omega$
$R_6 = 360 K\Omega$
$R_7 = 16 K\Omega$
$R_8 = 5.1 K\Omega$
$R_9 = 270 \Omega$
$R_{10} = 130 \Omega$
$R_{11} = 11 K\Omega$
$C_1 = 22$ nF
$C_2 = 10$ nF $C_3 = 12$ nF
$C_4 = 0.15$ μF The overall frequency response characteristic of the single signal transmitting circuit 2 is shown in FIG. 3C. Such frequency-response characteristic is obtained by addition of the frequency-response characteristics of FIGS. 3A and 3B. Thus, in the overall frequency-response characteristic of FIG. 3C, the attenuation ratio for the low-frequency band or portion of the input information signal increases, while the high-frequency-band cut-off frequency increases with increasing level of the high-frequency-band or portion of the input information signal. As is apparent from the graph in FIG. 3C, a desired dynamic range compression is achievable throughout the audio range of 20 Hz-20 KHz.

Returning to FIG. 1, it will be seen that, in the low-frequency band control unit 4, a low-frequency audio signal, which may be derived from the emitter of transistor $Q_1$, is applied to an input of an overshoot suppressor $4_a$, which determines the frequency at the knee of a frequency-response characteristic curve of FIG. 3A. The output of overshoot suppressor $4_a$ is applied to a weighting network $4_b$ which determines the gradient of the frequency-response characteristic curve, and produces a corresponding output. A control rectifier $4_c$ converts the output of weighting network $4_b$ to a DC voltage which voltage-current converter $4_d$ serves to convert to a DC current. This DC current, which is applied to the base of transistor $Q_1$, acts as a control signal for controlling the amount of attenuation provided by the low-frequency-band attenuation control circuit $2_a$.

In the high-frequency band control unit 5, an overshoot suppressor $5_a$ receives a high-frequency-band or portion of the audio signal from the emitter of transistor $Q_2$ to determine the frequency at the knee of a frequency-response characteristic curve shown in FIG. 3B. A weighting network $5_b$, control rectifier $5_c$, and voltage-current converter $5_d$ are arranged analogously to the similar elements $4_b$, $4_c$, $4_d$ in the low-frequency-band control unit 4. The voltage-current converter $5_d$ thus applies a DC current to the base of transistor $Q_2$ as a control signal so that the high-frequency-band attenuation control circuit $2_b$ will provide the frequency-response characteristics shown in FIG. 3B in response to changes in the amplitude of the high-frequency-band or portion of the input information signal.

In the arrangement shown in FIG. 1, an audio signal to be recorded on tape is applied at the input terminal 1 while the output terminal 3 is connected to a recording transducer or head (not shown). Signals recorded with the arrangement of FIG. 1 can be reproduced with the circuit arrangement shown in FIG. 4. In that arrangement, an operational amplifier 6 is provided with a positive input terminal $6_a$ connected to a terminal 7 for receiving the reproduced signals. The output of the operational amplifier 6 is then connected to an input terminal 8, and also to input terminal 1 of the single signal transmitting circuit 2. The output terminal 3 of the single signal transmitting circuit 2 is connected to a negative feedback input $6_b$ of the operational amplifier 6. Because the signal transmitting circuit 2 according to this invention is arranged in the negative feedback path of amplifier 6, the overall frequency response characteristics thereof will be the inverse of those shown in FIGS. 3A, 3B and 3C. Therefore, if a reproduced processed audio signal is applied at terminal 7, and a speaker is connected to terminal 8, good quality noise-free audio will be produced.

Figure 4:
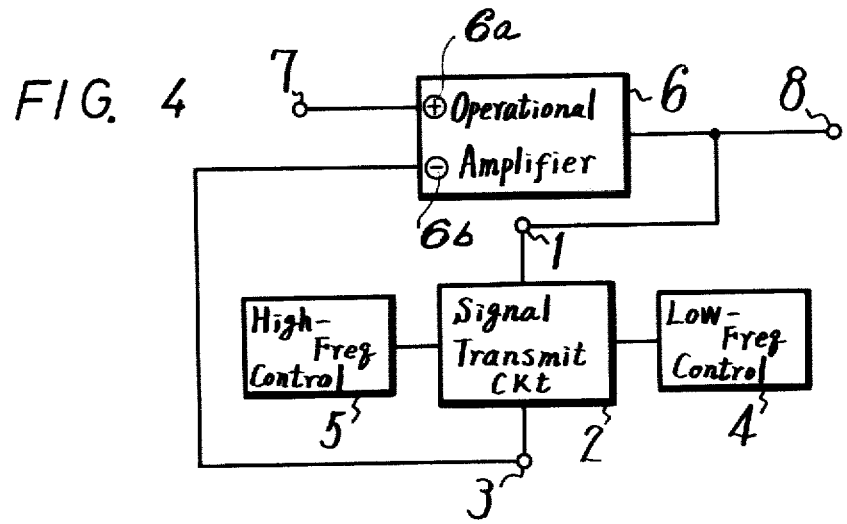
FIG. 4 is a block diagram showing an arrangement of a signal processing circuit according to the present invention for use with a reproducing apparatus.
Figure 5A:
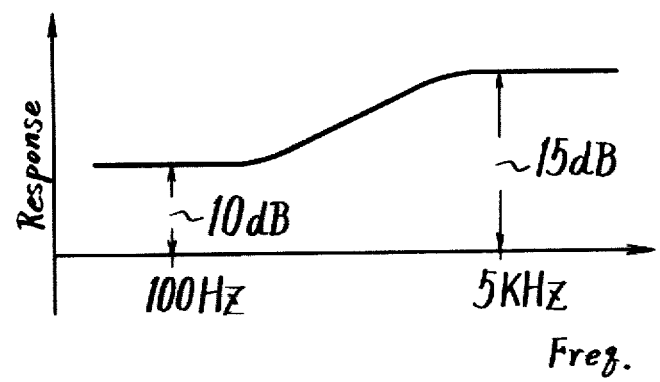
FIG. 5A and 5B are graphs showing frequency-response characteristics and to which reference will be made in explaining the arrangment shown in FIG. 4.
Figure 5B:
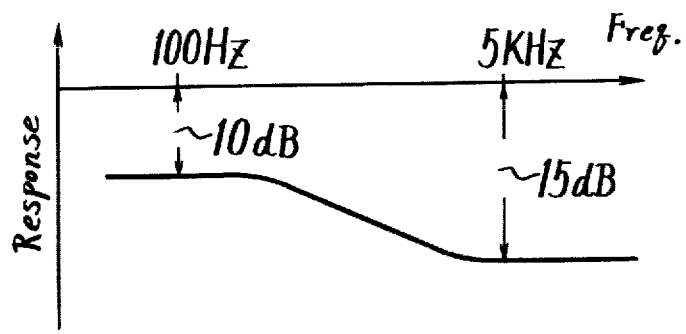

An example of the frequency-response curves of an input information signal recorded and later reproduced through the signal processing or transmitting circuit 2 according to the present invention is shown in FIG. 5A and 5B. When an audio signal to be recorded is applied at the signal input terminal 1, a processed signal appears at the output terminal 3 according to the frequency-response characteristic shown in FIG. 5A. Thus, in this example, a processed signal to be recorded will have a flat portion enhanced by 10 dB in the vicinity of 100 Hz and a flat portion enhanced by 15 dB in the vicinity of 5 KHz. This processed signal is then recorded on a magnetic tape. When the signal so recorded is reproduced from the magnetic tape, and the signal transmitting circuit 2 is arranged as shown in FIG. 4, then the frequency-response curve of FIG. 5A is inverted as is shown in FIG. 5B, so that substantially the original audio signal will be provided at terminal 8, Thus, on recording, the low-amplitude, low-frequency-band audio signals and the low-amplitude, high-frequency-band audio signals are enhanced, while upon reproduction, the low-amplitude audio signals are brought back to their normal levels and any low- or high-frequency noise, such as hum or hiss, is attenuated and thereby suppressed. Therefore, the signal-to-noise ratio of the reproduced audio signal is improved.

The reason for the suppression of noise signals from the recorded and reproduced audio signals is apparent from a consideration of the frequency-response characteristics shown in FIG. 3C. As described above, upon recording, the signal processing or transmitting circuit provides a comparatively high gain for the low-level, low-frequency audio signals so that the level of the latter, as recorded and then reproduced will be significantly greater than the level of low-frequency noise introduced by the tape-recording and/or reproducing process. Likewise, since the cut-off frequency increases with increasing level of the high-frequency band of the audio input signals, the gain for the low-level, high-frequency audio signals will also be large enough so that the level of such signals, as recorded and reproduced, will be greater than that of the high-frequency noise introduced by the recording and/or reproducing process. Conversely, upon reproduction, the lower-level high- and low-frequency audio signals will be attenuated more than the higher level audio signals in such frequency bands, so that the original audio signal will be restored upon reproduction. However, because the level of the recorded signal is greater than the level of the noise introduced in the recording and reproducing of the signal, the reproduced signal is provided with a high signal-to-noise ratio.

It is an important feature of this invention that the low-frequency-band audio signals and the high-frequency-band audio signals are controlled and processed independently. Thus, on the one hand, if the input audio signals contain lower-frequency signals of high amplitude and higher-frequency signals of low amplitude, the signal processing circuit will be able to suppress high-frequency noise, such as hiss, without distorting the low-frequency signal. On the other hand, if the input audio signals contain mostly higher-frequency signals, the signal processing circuit will reduce lower-frequency noises, such as hum, without distorting the higher-frequency audio signals.

Accordingly, the present invention may be advantageously applied to the sound or audio system of a video tape recorder to obtain good quality reproduced sound even if the tape speed is extremely slow and the track width for recording the audio signal is quite narrow.

Although the present invention has been described above as applied to the sound system of the video tape recorder, it will be appreciated that the invention can be readily used in connection with any signal transmission system (e.g., radio, telephone cable, etc.) in which the transmission medium is likely to introduce noise to the input information signal.

Further, although an embodiment of the invention has been described in detail herein with reference to the accompanying drawings, it is to be understood that the invention is not limited to that precise embodiment, and that many modifications and variations can be effected therein by one skilled in the art without departing from the scope and spirit of the present invention as defined in the appended claims.

I claim as my invention:

1. A circuit for processing input signals extending over a predetermined frequency spectrum to enhance the signal-to-noise ratio over said spectrum, comprising:
   input means for receiving said input signals;
   output means for providing processed signals;
   control means for providing a first control signal in accordance with the amplitude of said input signals at a lower-frequency part of said spectrum and for providing a second control signal which is independent of said first control signal and is in accordance with the amplitude of said input signals at a higher-frequency part of said spectrum;
   means defining the only signal paths from said input means to said output means and consisting essentially of low-pass filter means having a controllable frequency response characteristic for controlling the attenuation of signals at said lower-frequency part of said spectrum in response to said first control signal so as to increase said attenuation with increasing amplitude of said input signals at said lower-frequency part of the spectrum, and high-pass filter means having a controllable frequency response characteristic for controlling the attenuation of signals at said higher-frequency part of said spectrum in response to said second control signal by increasing a cut-off frequency of said high-pass filter means with increasing amplitude of said input signals at said higher-frequency part of the spectrum; and
   an amplifier having an input terminal, an output terminal, and a feedback terminal, said output terminal being coupled to said input means and said output means being coupled to said feedback terminal.

2. A circuit according to claim 1, in which said high-pass filter means and said low-pass filter means are connected in parallel between said input means and said output means.

3. A circuit according to claim 2, in which said low-pass filter means includes a reactive device, and an attenuator having a variable impedance which is controllable in response to said first control signal.

4. A circuit according to claim 3, in which said attenuator includes a transistor having current-carrying electrodes and a control electrode, said variable impedance includes the current-carrying electrodes of said transistor, and said first control signal is applied to said control electrode.

5. A circuit according to claim 2, in which, for varying said cut-off frequency, said high-pass filter means includes a transistor having current-carrying electrodes and control electrode, said current-carrying electrodes form a variable impedance circuit to control said cut-off frequency, and said second control signal is applied to said control electrode.

6. A circuit according to claim 1, in which said control means comprises a low-frequency band control unit and a high-frequency band control unit for providing said first and second control signals, respectively; and in which each said band control unit includes an overshoot suppressor to receive the input signals at the respective part of said spectrum and to provide an output therefrom, a weighting network to receive the output of said overshoot suppressor and to provide an output therefrom, and rectifier means to receive the output of said weighting network and to provide in response thereto the respective one of said first and second control signals.

7. A signal processing circuit, comprising:
   a pair of input terminals;
   first and second capacitors connected in series with each other to form a first series circuit across said input terminals;
   a third capacitor and a first controllable impedance circuit connected in series with each other to form a second series circuit connected in parallel with said second capacitor;
   first and second resistors connected in series with each other to form a third series circuit connected in parallel with said second capacitor;
   a pair of output terminals connected at opposite ends of said second resistor;
   said first, second and third series circuits constituting a high-pass filter with a variable cut-off frequency;
   a third resistor and a fourth capacitor connected in series with each other to form a fourth series circuit across said input terminals;
   a fourth resistor and a second controllable impedance circuit connected in series with each other to form a fifth series circuit in parallel with said fourth capacitor;
   a fifth resistor connecting said second controllable impedance to one of said output terminals;
   said fourth and fifth series circuits and said fifth resistor constituting a variably attenuating low-pass filter, said high and low-pass filters defining the only signal paths between said input terminals and said output terminals; and
   means for controlling the impedances of said first and second controllable impedance circuits in response to the amplitude in relatively high and low frequency bands of a signal applied to said input terminals so that said cut-off frequency of the high-pass filter is increased in response to an increase in said amplitude in said high-frequency band and the attenuation by said low-pass filter is increased in response to an increase in said amplitude in said low-frequency band.

* * * * *